(12) United States Patent
Akamatsu et al.

(10) Patent No.: US 7,339,206 B2
(45) Date of Patent: Mar. 4, 2008

(54) FIELD EFFECT TRANSISTOR INCLUDING A GROUP III-V COMPOUND SEMICONDUCTOR LAYER

(75) Inventors: Shiro Akamatsu, Tokushima (JP); Yuji Ohmaki, Tokushima (JP)

(73) Assignee: Nichia Corporation, Ana-Shi Tokushima (JP)

( * ) Notice: Subject to any disclaimer, the term of this patent is extended or adjusted under 35 U.S.C. 154(b) by 0 days.

(21) Appl. No.: 11/387,847

(22) Filed: Mar. 24, 2006

(65) Prior Publication Data

US 2006/0231861 A1 Oct. 19, 2006

(30) Foreign Application Priority Data

Mar. 25, 2005 (JP) ............................. 2005-088909

(51) Int. Cl.
  H01L 31/0328 (2006.01)
  H01L 31/0336 (2006.01)
  H01L 31/072 (2006.01)
  H01L 31/109 (2006.01)
  H01L 29/06 (2006.01)

(52) U.S. Cl. .................. 257/192; 257/24; 257/27; 257/189; 257/194; 257/195

(58) Field of Classification Search .................. 257/24, 257/27, 189, 192, 194, 195
See application file for complete search history.

(56) References Cited

U.S. PATENT DOCUMENTS

| | | | | |
|---|---|---|---|---|
| 4,236,166 A | * | 11/1980 | Cho et al. ................. | 257/192 |
| 4,698,654 A | * | 10/1987 | Kohn ....................... | 257/260 |
| 4,712,122 A | * | 12/1987 | Nishizawa et al. ........ | 257/27 |
| 4,768,071 A | * | 8/1988 | Etienne et al. ............ | 257/27 |
| 4,806,998 A | * | 2/1989 | Vinter et al. .............. | 257/192 |
| 5,234,851 A | * | 8/1993 | Korman et al. ........... | 438/268 |
| 5,270,798 A | * | 12/1993 | Pao et al. ................. | 257/134 |
| 5,399,887 A | | 3/1995 | Weitzel et al. | |
| 5,753,938 A | * | 5/1998 | Thapar et al. ............. | 257/192 |
| 6,396,085 B1 | * | 5/2002 | Yoshida .................... | 257/135 |
| 6,531,748 B2 | * | 3/2003 | Pfirsch ..................... | 257/368 |
| 6,737,677 B2 | * | 5/2004 | Shimoida et al. ......... | 257/77 |
| 2004/0079989 A1 | * | 4/2004 | Kaneko et al. ........... | 257/328 |

(Continued)

FOREIGN PATENT DOCUMENTS

| | | |
|---|---|---|
| JP | 2000-174285 A | 6/2000 |
| JP | 2003-297856 A | 10/2003 |
| JP | 2004-319552 A | 11/2004 |

*Primary Examiner*—Ida M. Soward
(74) *Attorney, Agent, or Firm*—Birch, Stewart, Kolasch & Birch, LLP

(57) ABSTRACT

A field effect transistor (FET) includes a first semiconductor layer and a second semiconductor layer, the second semiconductor layer being formed on the first semiconductor layer and having a band gap energy greater than that of the first semiconductor layer. The first and second semiconductor layers are made of a Group III-V compound semiconductor layer, formed on the first semiconductor layer are a gate electrode 36 and a source electrode 35, formed on the second semiconductor layer is a drain electrode 37, and the drain electrode and the gate electrode are formed respectively on opposing planes of a semiconductor structure which contains the first and second semiconductor layers. This arrangement enables a drain's breakdown voltage to be increased in the FET, because the gate electrode 36 and the drain electrode 37 are respectively disposed, in a spatial separation of each other, on different planes instead of the same plane of the semiconductor structure.

20 Claims, 6 Drawing Sheets

U.S. PATENT DOCUMENTS

2004/0157355 A1* 8/2004 Kachi et al. .................. 438/46
2005/0012143 A1* 1/2005 Tanaka et al. .............. 257/328
2005/0029558 A1* 2/2005 Hatakeyama et al. ....... 257/264
2005/0199873 A1* 9/2005 Tanaka et al. ................ 257/20

* cited by examiner

FIELD EFFECT TRANSISTOR INCLUDING A GROUP III-V COMPOUND SEMICONDUCTOR LAYER

BACKGROUND OF THE INVENTION

1. Field of the Invention

The present invention relates to a field effect transistor which uses a gallium nitride-based compound semiconductor, and a method of manufacturing the same.

2. Description of the Related Art

A gallium nitride-based compound semiconductor has a wider forbidden band, so that a field effect transistor (FET) using such a semiconductor can be operated at higher frequencies and at higher voltages. In view of the FET's applicability as a high-output power semiconductor device, there have been proposed a metal semiconductor FET (MESFET), a high electron, mobility transistor (HEMT), and the like. A HEMT is a high-speed semiconductor device that is popularly used for operation at higher frequencies, and specifically, devices using a GaAs/AlGaAs heterojunction have been used for practical applications. Excellent microwave/millimeter wave characteristics of HEMTs have met widespread use for a low-noise, high-speed field effect transistor, e.g., for a satellite broadcasting receiver (refer to Japanese Patent Application Laid-Open No. 2003-297856, No. 2000-174285 and No. 2004-319552, for example).

In recent years, however, as the next-generation high-speed FET, more interests have been focused on a HEMT using a GaN-based compound (hereinafter referred to as a GaN-based HEMT) in place of a GaAs-based compound. Extensive researches have been repeated, because a GaN-based compound has a wide band gap and high saturated electron velocity which is estimated from electron effective mass, also because the GaN-based compound ensures a possibility that a high frequency device is realized for operation at higher power outputs, at higher breakdown voltages, and at a higher temperature range. FIG. 7 illustrates an example of HEMT structure using a GaN-based compound. The illustrated GaN-based HEMT 700, in a sequential lamination from the bottom on an insulating sapphire substrate 71, contains an AlN buffer layer 72, an undoped GaN layer 73 as an electron transit layer, and an n-type AlGaN layer 74 as a carrier supply layer. Also, formed on the upper surface of n-type AlGaN layer 74 are a source electrode 75, a gate electrode 76, and a drain electrode 77. In a HEMT with this structure, the n-type AlGaN layer 74 serving as a carrier supply layer supplies electrons to the undoped GaN layer 73 serving as an electron transit layer, and thus such supplied electrons transit, with high mobility, through the region 73*a* which serves as a channel contacting the n-type AlGaN layer 74 at the uppermost portion of the GaN layer 73.

In order to achieve a high power output for the above-described HEMT, even a higher breakdown voltage must be so designed that a high voltage can be applied. In operation, however, when a higher voltage is applied between the source electrode 75 and the drain electrode 77, a portion of the device will be subjected to a large concentration of electric field, resulting in a device breakdown. In particular, a short circuit becomes problematic, which results from a dielectric breakdown between gate and drain electrodes. In a laterally structured device as illustrated in FIG. 7, where the source electrode 75, the gate electrode 76, and the drain electrode 77 are formed on the same plane, it would be difficult to maintain insulation, above several hundred volts, between these electrodes. Even when a certain extent of insulation can be maintained between the source and drain electrodes, application of a high voltage of as much as several thousand volts will cause a creeping discharge and the like, and a dielectric breakdown will problematically occur due to air existing between the source and drain electrodes or due to a failure of breakdown voltage in the insulation layer which covers these electrodes. In addition, with the above-described arrangement which is so structured that electric field easily get concentrated directly beneath the drain electrode, a dielectric breakdown is very likely to occur because a high voltage will be applied by a concentration of electric field while in operation at a high voltage. Such a dielectric breakdown has thus been hampering higher power outputs for HEMT devices.

The present invention has been made in order to solve the above-described problems. A main object of this invention is to provide a field effect transistor which realizes higher breakdown voltages to achieve higher power outputs, and to provide a method of manufacturing the same.

To attain the above object, a field effect transistor (FET) according to a first aspect of the present invention includes a source electrode, a gate electrode, a drain electrode and a semiconductor structure which contains a carrier transit layer. The semiconductor structure is made of a Group III-V compound semiconductor layer; disposed on or above the semiconductor structure are the gate electrode and the source electrode; and the drain electrode is disposed on opposing side of the semiconductor structure where the gate electrode is disposed. This arrangement enables a drain's breakdown voltage, especially breakdown voltage for the inter-electrode of drain-source or drain-gate to be increased in the FET, because the gate and source electrodes and the drain electrode are respectively disposed, in a spatial separation of each other, on different planes instead of the same plane of the semiconductor structure. With this arrangement, the FET also can be of a vertical FET semiconductor structure having a channel between the drain and source electrodes.

Also, in the field effect transistor according to a second aspect of the present invention, the semiconductor structure contains a first semiconductor layer and a second semiconductor layer which has a band gap energy greater than that of the first semiconductor layer; the gate electrode and the source electrode are disposed respectively on the first semiconductor layer side of the semiconductor structure; and the drain electrode is disposed on the second semiconductor layer side of the semiconductor structure. This arrangement enables a carrier to transit at higher mobility in a channel.

Furthermore, the field effect transistor (FET) according to a third aspect of the present invention includes a source electrode, a gate electrode, a drain electrode and a semiconductor structure which contains a first semiconductor layer and a second semiconductor layer having a band gap energy greater than that of the first semiconductor layer. The first and second semiconductor layers are made of a gallium nitride-based compound semiconductor layer; disposed on the first semiconductor layer side of the semiconductor structure are the gate electrode and the source electrode; disposed on the second semiconductor layer side is the drain electrode and the drain electrode is disposed on opposing side of the semiconductor structure where the source electrode is disposed. This arrangement enables an FET's breakdown voltage to be increased, because the source and drain electrodes are respectively disposed, such as the invention according to the above-described first and second aspect, on the opposing planes. With this arrangement, the source and gate electrodes are disposed on the first semiconductor layer, and the drain electrode is disposed on the second semiconductor layer, so that a concentration of electric field can be mitigated between the drain and gate electrodes.

Furthermore, in the field effect transistor according to a fourth aspect of the present invention, the second semiconductor layer has an AlGaN layer.

Furthermore, in the field effect transistor according to a fifth aspect of the present invention, the second semiconductor layer has an undoped AlGaN layer and a Si-doped AlGaN layer. With this construction, a carrier scattering can be reduced at the interface of the first and second semiconductor layers.

Furthermore, in the field effect transistor according to a sixth aspect of the present invention, the carrier transit layer contained in the semiconductor structure has an end surface exposed on a side where the source electrode is disposed, and the source electrode is disposed to make an ohmic contact with the end surface. With this arrangement, even when the second semiconductor layer is an i-type GaN layer and the like, an electric current can be extracted to realize a field effect transistor with a high breakdown voltage.

Furthermore, in the field effect transistor according to a seventh aspect of the present invention, there is an intermediate layer disposed between the second semiconductor layer and the drain electrode. With this arrangement, the drain electrode and the second semiconductor layer can be spaced apart, so that a concentration of electric field can be mitigated by an increased distance between the drain and gate electrodes, resulting in an even higher breakdown voltage of the field effect transistor.

Furthermore, in the field effect transistor according to a eighth aspect of the present invention, the intermediate layer is made of GaN. With this construction, it is possible to prevent an extreme concentration of electric field into the gate electrode terminal, reducing an effect of surface level, so that the field effect transistor can be stably operated.

Furthermore, in the field effect transistor according to a ninth aspect of the present invention, the first semiconductor layer is a carrier transit layer, and the second semiconductor layer is a carrier supply layer.

Furthermore, in the field effect transistor according to an tenth aspect of the present invention, the field effect transistor is a high electron mobility transistor (HEMT).

Furthermore, in the field effect transistor according to a eleventh aspect of the present invention, the gate electrode is annularly disposed so as to surround an area where the source electrode is disposed, while the drain electrode is, further, annularly disposed so as to surround an area on opposing side of the semiconductor structure where the gate electrode is disposed. With this arrangement, the gate electrode is disposed between the drain and source electrodes, and the gate and drain electrodes are annularly disposed to prevent a concentration of electric current, resulting in realization of a high breakdown voltage.

Furthermore, in the field effect transistor according to a twelfth aspect of the present invention, the gate electrode being annularly disposed so as to surround an area on opposing side of the semiconductor structure where the drain electrode is disposed, while the source electrode is, further, annularly disposed so as to surround an area where the gate electrode is disposed. With this arrangement, the gate electrode is disposed between the drain and source electrodes, and the gate and drain electrodes are annularly disposed to prevent a concentration of electric current, resulting in realization of a high breakdown voltage.

Furthermore, a method of manufacturing a field effect transistor according to a thirteenth aspect of the present invention is in fabrication of a field effect transistor provided with a carrier transit layer and a carrier supply layer, the carrier supply layer being formed on or above the carrier transit layer and having a band gap energy greater than that of the carrier transit layer. The method includes a step of sequentially laminating at least the carrier transit layer and the carrier supply layer upon a substrate so that a semiconductor structure is formed; a step of forming a drain electrode on one side of the carrier supply and transit layers of the semiconductor structure; a step of forming a gate electrode and a source electrode on opposing side of the semiconductor structure where the drain electrode is formed; and a step of securing a side of the semiconductor structure where the drain electrode is formed or where the gate and source electrodes are formed to a support substrate and then removing the previously stated substrate. With this method, the gate and source electrodes and the drain electrode are respectively disposed on different surfaces instead of the same surface of the semiconductor structure, so that a field effect transistor is obtained which has high breakdown voltages between the gate and drain electrodes and between the source and drain electrodes.

Furthermore, in a method of manufacturing a field effect transistor according to a fourteenth aspect of the present invention, the drain electrode is disposed between the semiconductor structure and the support substrate. With this arrangement, a highly reliable insulation structure can be obtained because a portion between the source and gate electrodes is disposed on a side of the semiconductor structure, opposite the support substrate.

Furthermore, in a method of manufacturing a field effect transistor according to a fifteenth aspect of the present invention, the support substrate is a conductive substrate and secures to the semiconductor structure through a conductive material; and the drain electrode is electrically connected to the support substrate and also has an external connection on opposing side of the support substrate where the semiconductor structure is disposed. With this arrangement, a vertical FET structure wherein the support substrate is an extraction electrode of the drain electrode can be obtained.

Furthermore, in a method of manufacturing a field effect transistor according to a sixteenth aspect of the present invention, in the step of forming the semiconductor structure, an intermediate layer is laminated on or above the carrier supply layer, and the drain electrode is disposed on or above the intermediate layer, with the intermediate layer being partially disposed on or above the carrier supply layer.

According to a field effect transistor and a method of manufacturing the same in accordance with the present invention, high insulation properties can be attained by an arrangement where the gate electrode, the source electrode, and the drain electrode are spaced apart of each other, so that an increased breakdown voltage between these electrodes makes it possible to obtain a highly reliable field effect transistor which can be operated at a high power output. An increased breakdown voltage for the drain electrode, in particular, can improve a breakdown voltage of the field effect transistor.

DETAILED DESCRIPTION OF THE PREFERRED EMBODIMENTS

It should be noted that the formation on a semiconductor layer, as termed in the present disclosure, refers either to direct formation in close contact with that particular layer, or to an arrangement of forming with one or more intermediate layers or even through other intermediate materials. In addition, the term of a formation surface may be used, without being limited to the same and identical plane as the principal plane, to include the case of forming on other surfaces such as an end surface orthogonal to the principal plane.

Embodiment 1

Figure 1:
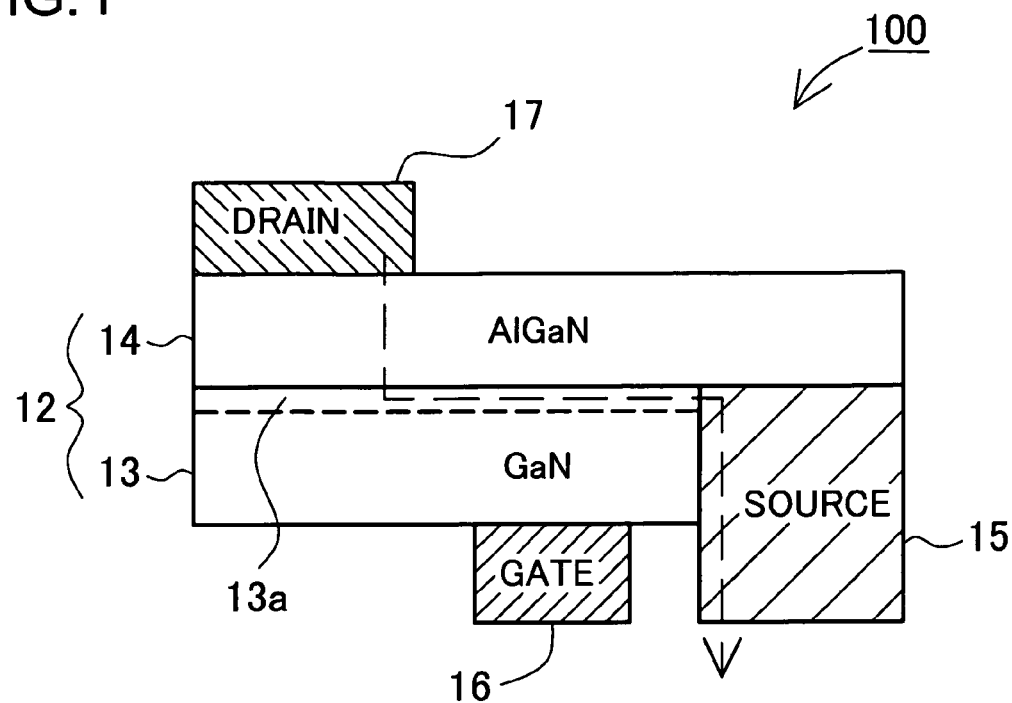
FIG. 1 is a schematic cross-sectional view illustrating an exemplary field effect transistor according to an embodiment (embodiment 1) of the present invention.

FIG. 1 illustrates an example that constitutes a GaN-based HEMT 100 as a field effect transistor according to the embodiment 1 of the present invention. The illustrated HEMT 100 has a semiconductor structure 12 in a sequential lamination of a carrier transit layer 13 as a first semiconductor layer, and a carrier supply layer 14 as a second semiconductor layer. Also, there are formed a drain electrode 17 on an upper surface of the carrier supply layer 14, and a gate electrode 16 on an lower surface of the carrier transit layer 13, respectively. On the other hand, there is a source electrode 15 formed on an end surface of the carrier transit layer 13, i.e., on a surface which is substantially perpendicular to the surface where the carrier transit layer 13 is in contact with the carrier supply layer 14, the surface being a right end surface of the GaN layer when viewed in FIG. 1. These source and drain electrodes 15 and 17 are disposed in an ohmic contact with the semiconductor structure 12 which contains the first and second semiconductor layers, while the gate electrode 16 is in a Schottky contact. In the GaN-based HEMT 100 with this structure, the carrier supply layer 14 supplies electrons, as a carrier, to the carrier transit layer 13, and such supplied electrons form a 2-dimensional electron gas (2DEG) layer, on an upper portion of the carrier transit layer 13, at the interface with the carrier supply layer 14, with the 2DEG layer being used as a channel 13a for the electrons to transit through with high mobility. In this way, when the carrier is mainly an electron, the carrier transit layer 13 will serve as an electron transit layer. A size of the channel 13a is controlled by a depletion layer which is formed by a gate voltage $V_G$ being applied on the gate electrode 16. A size of the depletion layer is controlled by a reverse voltage being applied on the gate electrode 16, which performs a control of the drain current $I_D$, i.e., ON/OFF switching of the HEMT.

(Carrier Transit Layer 13, Carrier Supply Layer 14)

The first and second semiconductor layers respectively are a nitride-based semiconductor layer, and preferably use an $Al_xIn_yGa_{1-x-y}N$ ($0 \leq x$, $0 \leq y$, $x+y \leq 1$). In particular, with the second semiconductor layer having a band gap energy greater than that of the first semiconductor layer, the second semiconductor layer can function as a carrier supply layer and the first semiconductor layer can function as a carrier transit layer, respectively. The carrier supply layer 14 supplies a carrier to the carrier transit layer 13. The carrier supply layer 14 is preferably an n-type nitride semiconductor layer. The carrier supply layer 14 is doped with a dopant in order to increase a carrier density, and it is preferred that Si being an n-type impurity as a dopant be contained by the order of $1 \times 10^{18}$ to $1 \times 10^{20}$ per cubic cm, resulting in an increased carrier density. When Si is larger than $1 \times 10^{20}$ per cubic cm, a crystallinity of the second semiconductor layer will become poor. Also, the carrier supply layer can have a reduced gate leakage current and a resultantly increased a breakdown voltage by reducing the amount of dopant or by forming with undoped. In the example shown in FIG. 1, an n-type AlGaN layer is employed for the carrier supply layer 14, and an undoped GaN layer is employed for the carrier transit layer 13. An i-type AlGaN layer for the carrier supply layer can also contribute to higher breakdown voltages. The carrier transit layer, on the other hand, may be doped with a suitable dopant to reduce a carrier transition in the carrier transit layer other than the channel. In the case where the carrier transit layer is doped with an n-type impurity, an $n^-$-type is preferred because n-type or $n^+$-type may cause an unintended electric current to flow at the time of switching off, which results from formation of a capacitance. Thus, OFF-state characteristics can be controlled by means of a carrier density in the carrier transit layer. Also, in the case of a normally-OFF type, it is preferable that the carrier transit layer be an i-layer, e.g., an undoped layer. On the other hand, the nitride semiconductor layer tends to be an n-type due to a nitrogen vacancy occurring at the time of formation and can therefore be doped with a p-type impurity to the extent of compensating the vacancy. As for a film thickness for the first and second semiconductor layers, without being specifically limited, it is preferred that the first semiconductor layer be preferably between 1 µm and 5 µm, more preferably between 2 µm and 3 µm, and that the second semiconductor layer be preferably between 5 nm and 500 nm, more preferably between 5 nm and 50 nm, so that the carrier transits with high mobility in a device which has carrier supply and transit layers. It is further preferred for a practical application that a distance from a gate electrode formation surface of the first semiconductor layer to the interface between the first and second semiconductors be set to be between 5 nm and 500 nm, more preferably between 5 nm and 50 nm in order to obtain a remarkable control effect of the depletion layer by the gate electrode for controlling the current flow.

(Electrode)

Of each electrode to be formed on a top surface of the carrier supply layer 14, both the source electrode 15 and the drain electrode 17 are ohmic electrodes, and the gate electrode 16 is a Schottky electrode. These electrodes can have a contact layer (not shown) interposed respectively in order to obtain ohmic and Schottky characteristics. For example, the source electrode 15 and the drain electrode 17 constitute an ohmic electrode at the interface with the ohmic contact layer formed on the carrier supply layer 14, while the gate electrode 16 has Schottky junction characteristics at the interface contacting with the Schottky contact layer formed on the carrier supply layer 14.

Figure 2:
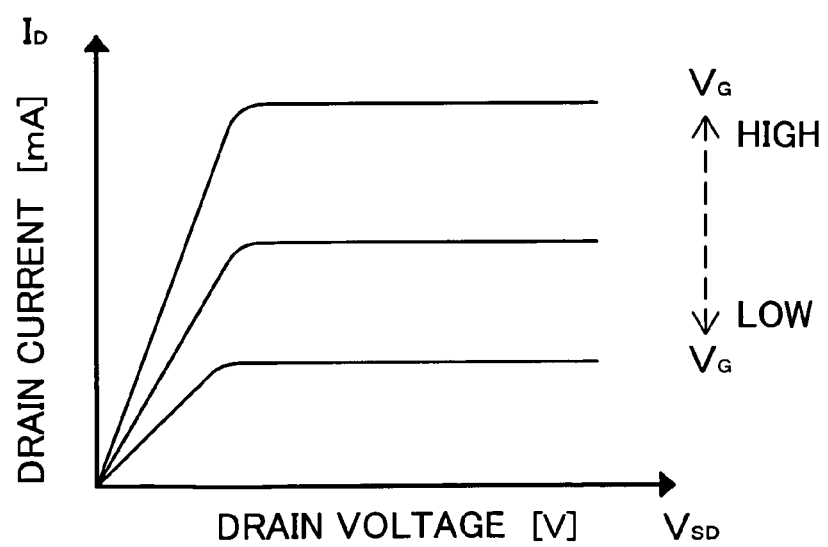
FIG. 2 is a graph illustrating how the flow of a drain current $I_D$ with respect to an inter-electrode (drain-source) voltage $V_{DS}$ is controlled by an applied gate voltage $V_G$.

In a field effect transistor, an electron serving as a carrier is emitted from a donor in the carrier supply layer 14, but this carrier electron, instead of staying put in the carrier supply layer 14, is pulled into the channel 13a having a greater affinity, and is stored in the vicinity of the interface. Since such a stored electron is not subjected to scattering by the dopant, the electron can transit through the channel 13a with high mobility. On the other hand, when a drain-source voltage $V_{DS}$ is applied between the source electrode 15 and the drain electrode 17, as shown in FIG. 1, a drain current $I_D$ flows through the channel 13a, between the source electrode 15 and the drain electrode 17. Also, when a gate voltage $V_G$ is applied on the gate electrode 16, a depletion layer corresponding to that voltage occurs and extends under the gate electrode 6, so that the drain current $I_D$ can be controlled by the gate voltage $V_G$ as shown in FIG. 2. Also, the Schottky contact layer directly beneath the gate electrode 16 serves as a barrier layer for suppressing an electric current (gate leakage current) which flows between the gate electrode 16 and the channel 13a, while the ohmic contact layer has an effect of reducing a contact resistance as ohmic electrodes of the source electrode 15 and the drain electrode 17.

(Gate Electrode 16)

The gate electrode 16 is formed on the side of the carrier transit layer 13 instead of the side of the carrier supply layer 14. Such formation causes the gate electrode 16 to be formed on a surface different from the drain electrode 17, i.e., on an opposing surface, in a spatial separation of each other. In this way, by spacing the gate electrode 16 and the drain electrode 17 apart of each other on opposite surfaces of the semiconductor structure 12 instead of forming on the same surface, insulation is facilitated between the two electrodes.

Figure 7:
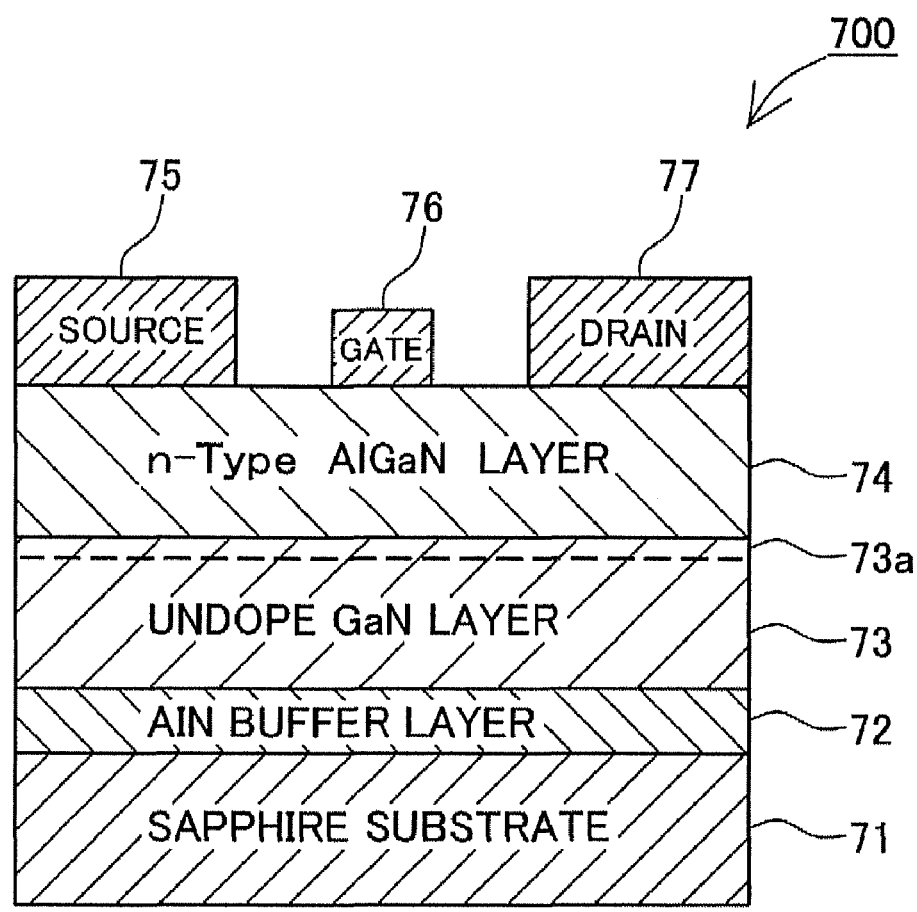
FIG. 7 is a schematic cross-sectional view illustrating an example of a conventional HEMT structure using a GaN-based compound.

When a voltage is provided to a HEMT having an electrode structure as shown in FIG. 7, a higher electric field will be applied on the drain end of the gate electrode 76 than on other portions. When a local intensity of electric field exceeds a certain value after a high voltage is provided to a field effect transistor device, there occurs an aforesaid device breakdown in that location, and it is important to avoid a concentration of electric field for purposes of an increased breakdown voltage of a device. In the present embodiment, the drain electrode is formed on a surface opposite the gate electrode so as to increase a distance of spatial separation between the drain electrode and the gate electrode. This arrangement mitigates the concentration of electric field working between the gate and drain electrodes, contributing to higher breakdown voltages for an electric field transistor device. Also, the drain electrode is formed at a location where this electrode is shifted away from the source electrode, e.g., where the drain electrode and the gate electrode are opposing separately of each other as shown in FIG. 1, rather than at a location opposite the gate electrode, e.g., where the drain electrode and the gate electrode are aligned to each other. This arrangement elongates a distance between the gate and drain electrodes for an increased breakdown voltage, as well as being able to effectively perform an gate electrode's original function of controlling the depletion layer, through placing the gate electrode between the drain and source electrodes.

(Source Electrode 15)

In the arrangement shown in FIG. 1, the gate electrode 16 is formed on a surface opposite the surface where the drain electrode 17 is formed, and also the source electrode 15 is formed on the side of the gate electrode 16, i.e., on a surface opposite the surface where the drain electrode 17 is formed. It goes without saying that this arrangement can avoid a problem of discharge resulting from the above-said insufficient insulation structure due to the drain and source electrodes being on the same surface, and also the inter-electrode (drain-source) breakdown voltage $V_{DSS}$ of a field effect transistor can be increased.

Embodiment 2

Figure 3:
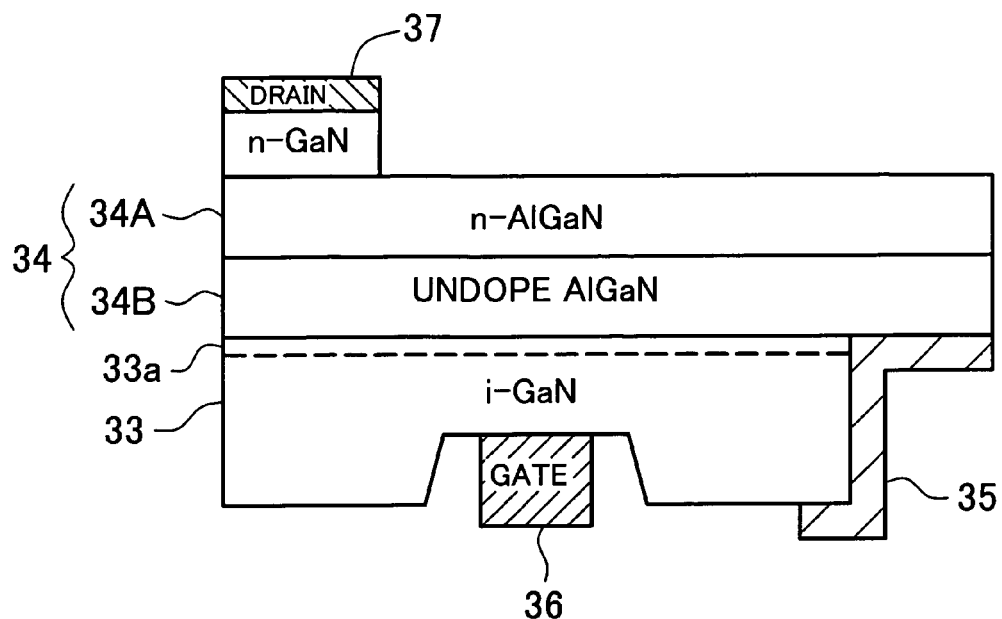
FIG. 3 is a schematic cross-sectional view illustrating an exemplary field effect transistor according to another embodiment (embodiment 2) of the present invention.

Also, FIG. 3 shows a cross-sectional view of the field effect transistor according to the embodiment 2 of the present invention. The illustrated field effect transistor is also a HEMT, where a GaN layer is formed as the intermediate layer 38 between the carrier supply layer 34 and the drain electrode 37.

In the case where an intermediate layer is provided between a carrier supply layer and a drain electrode, a film thickness between 1000 Å and 1 µm for the intermediate layer can mitigate a concentration of electric field through increasing the distance between the drain electrode and the gate electrode. This intermediate layer is preferably an n-type GaN layer, and particularly functions in a preferred manner as an intermediate layer through making it a layer doped with Si of less than $5 \times 10^{19}$ per cubic cm.

(Drain Electrode 37)

The wider the drain electrode 36 is spaced apart from the gate electrode 36 and the source electrode 35, the higher the breakdown voltage can be. For this purpose, in the arrangement according to the embodiment 2, through interposing the intermediate layer 38 between the carrier supply layer 34 and the drain electrode 37 as shown in FIG. 3, the drain electrode 37 and the gate electrode 36 can be spaced more apart from each other to mitigate a possible concentration of electric field occurring between them when a high voltage is applied, so that a higher breakdown voltage can be realized for a HEMT device. An n-type layer, e.g., an n-type GaN layer, can be employed for the intermediate layer, but without being limited to it.

(Gate Electrode 36)

The gate electrode is placed relatively closer to the channel 33a in order to ensure the control effect of the depletion layer by the gate electrode. In the case of FIG. 1, the gate electrode 16 is formed on the surface of GaN layer, but preferably as shown in FIG. 3, the location of forming the gate electrode 36 on the back surface of the carrier transit layer 33 is made closer to the channel 33a through making the carrier transit layer thinner by etching, etc. For example, when the carrier transit layer 33 is an undoped GaN layer, the distance is set to be on the order of 1000 Å between the gate electrode formation surface and the channel 33a.

(Source Electrode 35)

The source electrode 35 must cover at least a portion of end surface of the carrier transit layer 33. However, an increased area of the source electrode 35 can also facilitate interconnection for the electrodes and extraction of an electric current. For example, as shown in FIG. 3, the source electrode 35 can also be extended so as to continue from the end surface to the bottom surface of the carrier transit layer 33, or to continue to the bottom surface of the carrier supply layer 34. In this way, by providing an electrode portion extended below the carrier transit and supply layers, that electrode portion can serve as a pad portion. This assists in wiring out of the same surface as the gate electrode 36, and a simultaneous interconnection can be made to the gate electrode 36 and the source electrode 35, with a wiring work being facilitated that much.

Furthermore, when an n-type GaN layer or an AlGaN layer is employed for a carrier transit layer, the source electrode can be formed also on the surface side instead of the end surface of the carrier transit layer. When an i-type GaN layer is employed for the carrier transit layer, the source electrode formed on the surface does not allow an electric current to flow because of a high resistance. When an n-type GaN layer or an AlGaN layer is used, however, the above-described arrangement can be employed.

(Carrier Supply Layer 34)

Furthermore, in the case shown in FIG. 3, the carrier supply layer 34 is made of an n-type AlGaN layer 34A and an undoped AlGaN layer 34B. By setting the interface with the carrier transit layer 33 so as to be the undoped AlGaN layer 34B, it is possible to avoid reduced mobility of the carrier which is scattered by impurities in the AlGaN layer at the interface, or in the vicinity of the channel 33a, so that high carrier mobility can be realized. Also by means of modulation dope and the like, a similar effect can be obtained through reducing a doping amount in the carrier supply layer in the vicinity of the interface. In the case where the carrier supply layer is divided into a plurality of layers as described above, or when a doping amount is varied, it is believed that the undoped layer or less doped layer supply a little carrier or does not supply. In this sense, it may be understood that such a layer is not performing its own function as a carrier supply layer. In this disclosure, however, it should be noted that such a layer is also included in the carrier supply layer, for necessity of distinguishing a layer rather than a function.

Embodiment 3

Figure 4:
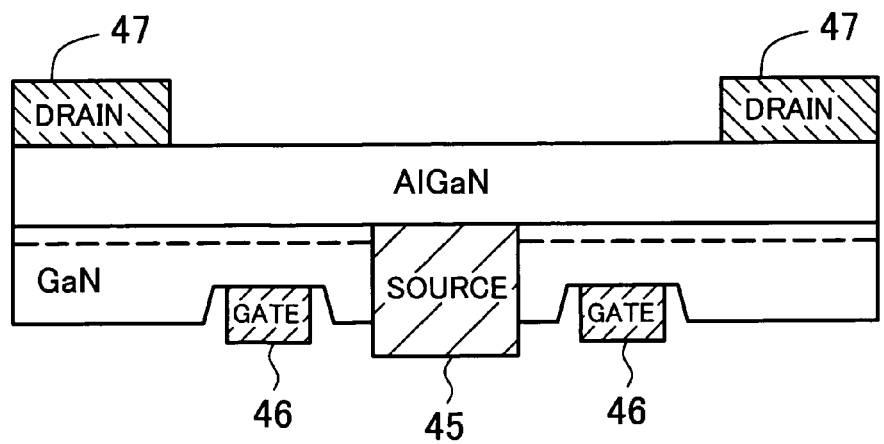
FIG. 4 is a schematic cross-sectional view illustrating an exemplary field effect transistor according to yet another embodiment (embodiment 3) of the present invention.
Figure 5:
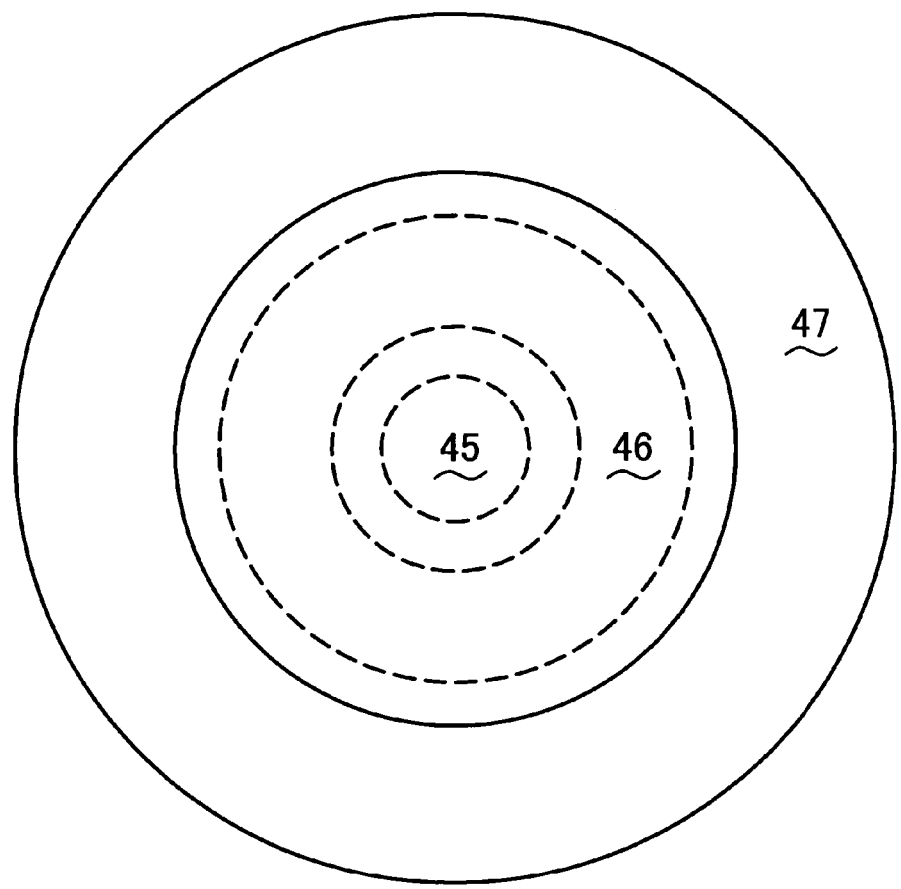
FIG. 5 is a schematic plan view illustrating the field effect transistor shown in FIG. 4.

Also, as shown in the cross-sectional view of FIG. 4 and in the plan view of FIG. 5, a HEMT device can be formed in a circular shape using an annular electrode. In the case where a rectangular electrode is employed, a breakdown voltage tended to be poor because a portion such as a corner of electrode is formed with an electric field being easily concentrated. Therefore, annular or circular formation of electrode without such a portion can avoid a local concentration of voltage and current, help improve a breakdown voltage as compared to an arrangement with a rectangular electrode, and achieve an added reliability and stability. In the example of FIG. 5, the source electrode 45 is circularly formed on the back surface of the undoped GaN layer, around which the gate electrode 46 is annularly formed with the source electrode 45 in the center. In addition, a drain electrode 47 is annularly formed, on the n-type AlGaN layer, in a concentric, circular manner so that the gate electrode 46 on the back surface of the semiconductor structure is surrounded. With this arrangement, any portion between the drain electrode 47 and the source electrode 45 is maintained at a substantially constant distance for formation of the gate electrode 46, so that a switching control can be performed with the gate voltage $V_G$. This arrangement further enables a concentration of inter-electrode electric field to be mitigated and a HEMT device to be realized with a high breakdown voltage.

Embodiment 4

Figure 6:
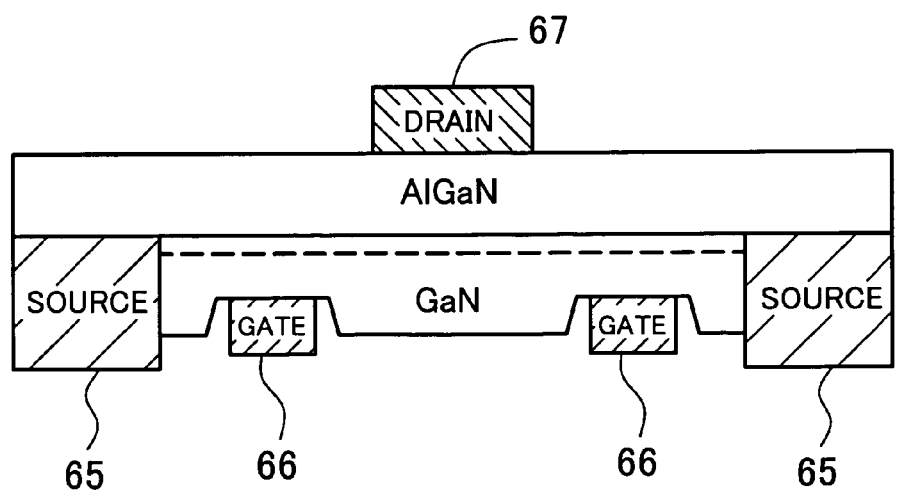
FIG. 6 is a schematic cross-sectional view illustrating an exemplary field effect transistor according to an alternative embodiment (embodiment 4) of the present invention.

In a field effect transistor, switching is enabled by controlling a depletion layer through disposing a gate electrode substantially in an even manner between a drain electrode and a source electrode. Therefore, a replaced arrangement of the drain electrode 67 and the source electrode 65, as shown in FIG. 6, as the embodiment 4 can also be employed, without being limited to the above-described arrangement. Also in the arrangement in FIG. 6, like in FIG. 5, with the drain electrode 67 in the center, the gate electrode 66 is annularly arranged inside the annular source electrode 65, maintaining a substantially constant distance between the drain electrode 67 and the source electrode 65. This arrangement enables a field effect transistor with a high breakdown voltage to be obtained, which avoids a concentration of electric field, like in FIG. 4.

(Field Effect Transistor)

In each embodiment, a HEMT device with electrodes being formed on opposite sides of the semiconductor structure can be fabricated through a bonding structure where the semicondutor structure is bonded on a support substrate and then a growth substrate is removed. However, it is also possible to fabricate the device by epitaxially growing the semiconductor structure on a conductive substrate such as a GaN substrate, etc. and then forming electrodes on opposite sides of the semiconductor structure containing the GaN substrate, that is, on the surface of semiconductor structure serving as a growth surface and on the back surface of the opposing GaN substrate.

A GaN-based HEMT is made of a gallium nitride-based compound semiconductor. The gallium nitride-based compound semiconductor layer has a buffer layer formed on a substrate as may be necessary, and further have the carrier transit layer 33 and the carrier supply layer 34 epitaxially grown in a sequential manner, and still further have electrodes laminated. As for a method of crystal growth, a process by such as metal-organic chemical vapor deposition (MOCVD), hydride vapor phase epitaxy (HVPE), and molecular-beam epitaxy (MBE) can be employed. A gallium nitride-based compound semiconductor is expressed in the general formula of $In_xAl_yGa_{1-x-y}N$ ($0 \leq x$, $0 \leq y$, $x+y \leq 1$), and B, P, or As may be mixed in the crystal. Also in the present disclosure, each semiconductor layer, and carrier supply and transit layers are not specifically limited to being of a single layer or a multilayer. In addition, an n-type impurity or a p-type impurity may be suitably contained in the nitride semiconductor layer. For an n-type impurity, Group IV or VI elements such as Si, Ge, Sn, S, O, Ti, Zr, etc. can be used, preferably Si, Ge, and Sn being used, and most preferably Si being used. For a p-type impurity, on the other hand, without being specifically limited, Be, Zn, Mn, Cr, Mg, Ca, etc. can be named, preferably Mg being used. This selection enables a nitride semiconductor of each conduction type to be formed. Further, for a growth substrate which forms a semiconductor structure, an insulating sapphire substrate, a conductive GaN substrate, etc. can be employed. For a support substrate, a conductive substrate such as a SiC substrate and Cu—W substrate having a higher thermal conductivity and excellent heat dissipation can be employed.

In each embodiment, a unipolar device that uses electrons as the carriers will be explained. However, in a case where using holes prepared by making the conductivity type of the carriers opposite, the device can be made a transistor using the holes.

(Semiconductor Structure, Device Structure)

The semiconductor structure comprises at least the carrier transit layer or a semiconductor layer served as the channel, and this layer can be interposed between the source and drain electrodes. Additionally, the semiconductor structure comprises the carrier supply layer adjacent to the carrier transit layer. It can provide a structure that the source and drain electrodes are provided to interpose the carrier supply layer in between, and one of the electrodes is provided on a side of the carrier transit layer of the semiconductor structure. Such as each embodiment, when the drain electrode is formed on a side of the carrier supply layer of the semiconductor structure, on the side of the carrier transit layer or the underlying layer of the semiconductor structure, i-type layer of insulating or semi-insulating can be formed into a relatively thick layer. It would be facilitated that the gate electrode is provided on a side of the source electrode in the semiconductor structure. Consequently, breakdown voltage in the FET can be increased because of higher insulation properties and mitigation of the concentration of electric field between the gate and drain electrodes. On the other hand, when the gate electrode is provided on the side of the carrier supply layer, the gate electrode structure can be preferably formed because it is not necessary to fabricate a recess structure to the thick i-type layer on the side of the carrier transit layer.

Figure 9:
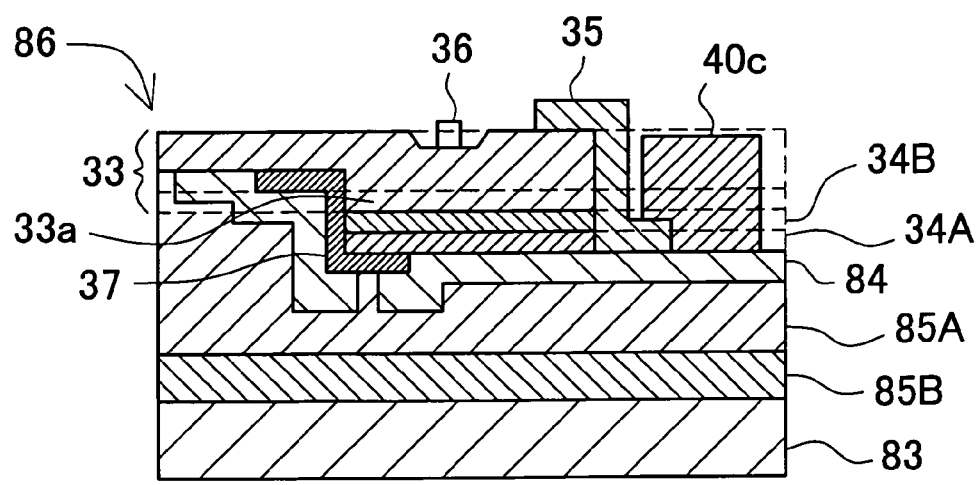
FIG. 9 is a schematic cross-sectional view illustrating a field effect transistor according to an embodiment of the present invention.

FIG. 9 shows a schematic cross-sectional view of an FET. As shown in FIG. 9, in between the source or drain electrode and the carrier supply layer, it can be employed that these electrodes is directly formed on the carrier supply layer such as each embodiment, an intermediate layer is interposed therebetween, and carrier transit layer or its end portion exposed are provided for contact with these electrodes. As described above, in case that the carrier transit layer provides for a base portion or the side of the carrier supply layer provides for processing, as for processing the carrier transit layer and forming the electrode on an end surface thereof, it is preferable that the electrode on the side of the carrier supply layer provides for the electrode to be formed on the end portion of the carrier transit layer. Consequently, as shown in FIG. 9, on the side of the carrier supply layer, the electrode to be formed on the end surface is formed on an insulating film 84 and an end surface of the semiconductor structure where a semiconductor structure 86 is exposed by removal.

In each embodiment, while the electrode of the carrier supply layer side and the electrode of the carrier transit layer side are disposed so as to oppose each other with the semiconductor structure 86 in between, because it suffices that on each electrode there are provided the drain electrode and the gate and source electrodes, as the drain electrode there may also be used the electrode of the carrier transit layer side.

(Source, Gate, Drain Electrode)

Electrodes such as the source electrode 35, gate electrode 36, and drain electrode 37 are typically formed with a composition different from semiconductor materials constituting the device. The electrode is made of a highly conductive material such as Ti, Al, Cu, W, Au, Ag, Mo, Ni, Pt, In, Rh, Ir, Cr, etc. Conductive oxides and conductive plastics with conductivity can also be used, without being limited to metal materials. Furthermore, the electrodes can be made of a single-elemental material as well as a multi-elemental material such as an alloyed material, a eutectic material, and a mixed crystal. For example, ITO, etc. can be used. A layer structure with more than one layer can also be employed. As an example of an ohmic electrode for an AlGaN-based or GaN-based semiconductor layer, a Ti/Al-based electrode is preferably employed, while, as an example of a Schottky electrode, an electrode including a Ni/Au-based material is preferably employed. Resultantly, the ohmic characteristics, the Schottky characteristics, etc. will function satisfactorily as required of an electrode for a HEMT. For example, in order to obtain an ohmic contact for the source electrode 35 and the drain electrode 37, Ti/Pt-, Ti/Au-, TiAl-, and V/Al-based metals are used, which are subjected to quick annealing at a temperature range of from 800° C. to 950° C. Also, for the gate electrode 36, W/Au, Ni/Au, or Au, Cu, Ni, etc. are used. The cross-sectional shape of the gate electrode is not specifically limited to a T-shape, an I-shape, etc., but a gate electrode with a T-shaped cross section will increase a cross-sectional area for the electrode and reduce an electrode resistance, so that characteristics of an operating frequency at higher frequencies can be improved. Also, in view of adherence, etc. between the ohmic electrode and a wire, a pad electrode may be formed on the surface in contact with the semiconductor layer. On the pad electrode is formed a metallized layer (bump) for contacting an external electrode, etc. The metallized layer consists of materials such as Ag, Au, Sn, In, Bi, Cu, Zn, etc. The electrode formation surface side of a field effect transistor is set opposite each external electrode which is provided on a sub-mount, with corresponding electrodes being joined together at the bump. Furthermore, a wire interconnection, etc. is performed upon the sub-mount. It is noted in the present disclosure that the Ti/Al, for example, refers to a sequential lamination of Ti and Al as viewed from the semiconductor side.

The substrate and the buffer layer are preferably removed. Existence of the buffer layer generates a leakage current, causing a leakage path to be formed, and so removal of the substrate as well as the buffer layer, for example, removal of the buffer layer by polishing a part of the semiconductor structure after removal of the substrate, can prevent such a disadvantage. Also, a buffer layer, a underlying layer, etc. at their initial growth stage tend to be poor in crystallinity, such a portion becoming a leakage path. It is preferable to form the carrier supply and transit layers and the first and second semiconductor layers after the portion of a leakage path is removed at a depth of a poor crystallinity. When the substrate is removed all, it is easier to remove the buffer layer. At this stage, a film thickness of the carrier transit layer may be adjusted to obtain desired characteristics instead of the above-mentioned partially thinning the portion of gate electrode formation.

(Method of Manufacturing Field Effect Transistor)

Figure 8A:
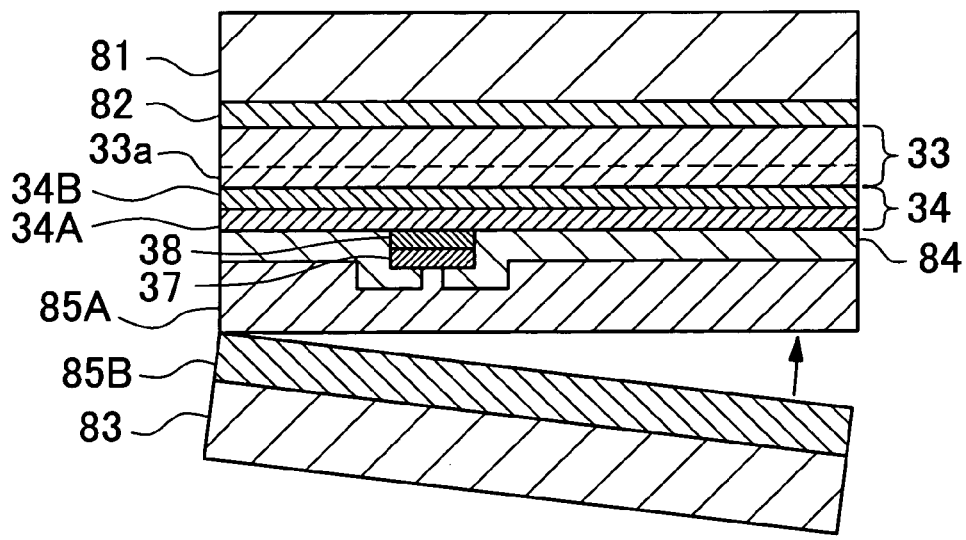
FIGS. 8A-8C are schematic cross-sectional views illustrating steps of manufacturing the field effect transistor shown in FIG. 3.
Figure 8B:
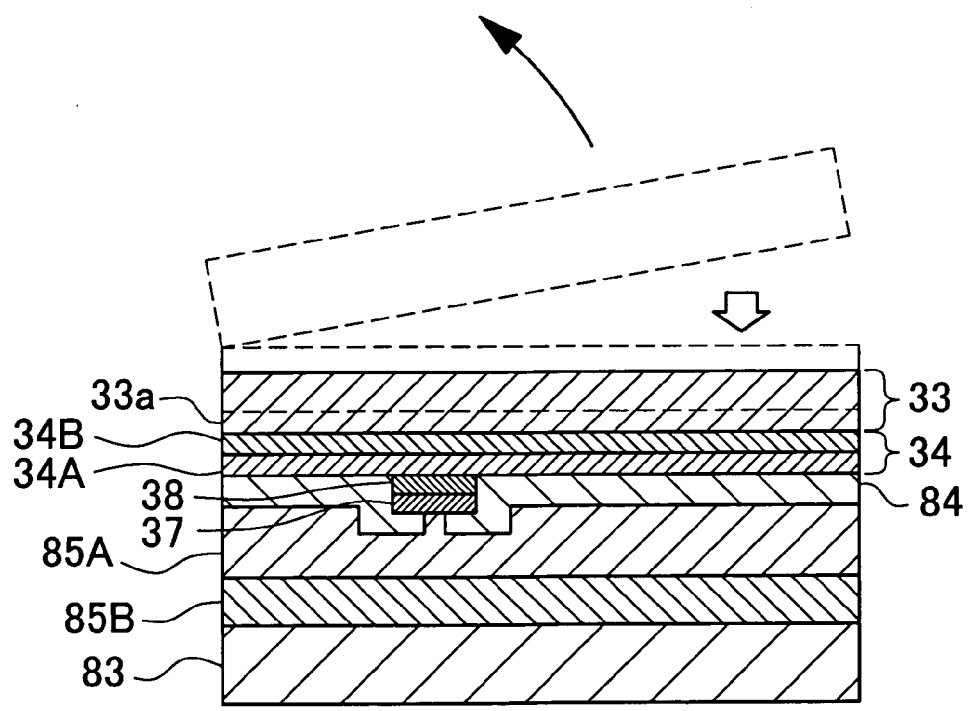
Figure 8C:
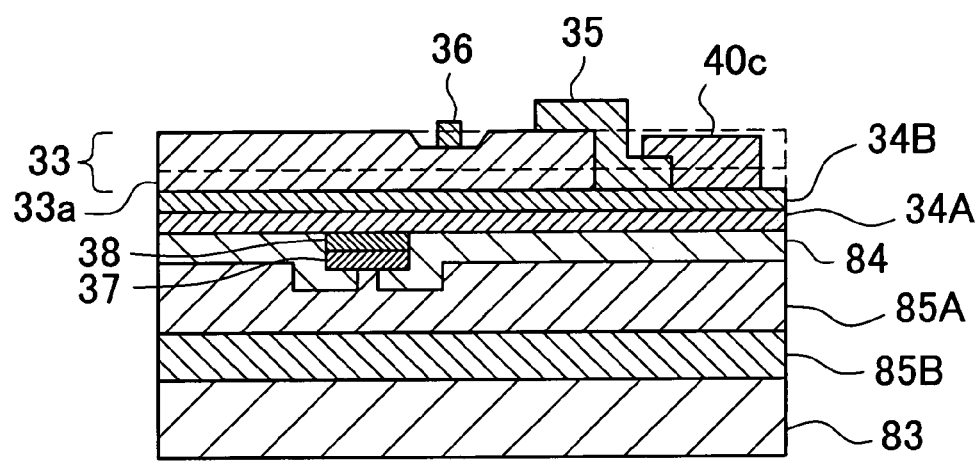

With reference to FIGS. 8A-8C as an exemplary method of manufacturing the field effect transistor according to the present embodiment, the method of manufacturing a HEMT shown in FIG. 3 will now be described in a sequential manner. FIGS. 8A-8C are schematic cross-sectional views intended to explain processes of manufacturing the field effect transistor shown in FIG. 3. Here, a GaN-based HEMT is fabricated on a sapphire substrate by means of MOCVD. First, a sapphire substrate as a growth substrate 81 is loaded into an MOCVD reactor, and a surface of C-plane sapphire substrate is allowed to reach substrate temperature of 1050° C. in a hydrogen atmosphere, with the hydrogen being allowed to flow for cleaning the substrate. Next, the substrate temperature is lowered down to 510° C., and hydrogen as a carrier gas, and both trimethyl gallium (TMG) and ammonium gasses as a source gas are used to grow a GaN of buffer layer 82 in a film thickness of about 200 Å on the substrate. Subsequently, after the growth of the buffer layer, the TMG gas alone is turned off and the substrate temperature is raised up to 1050° C. When the substrate temperature reaches 1050° C., TMG and ammonium gasses are again used, as a source gas, to grow an undoped GaN layer in a film thickness of 3 μm. This undoped GaN layer will serve as a carrier transit layer 33. It should be noted in the present disclosure that the "undope(d)" refers to being intentionally undoped, for example, with an impurity density being less than $1\times10^{17}$ per cubic cm, or without containing its dopant.

Next, at substrate temperature of 1050° C., TMG, trimethyl aluminum (TMA), and ammonium gasses, as a source gas, are used to grow the undoped AlGaN layer 34A in a film thickness of 50 Å, the layer consisting of $Al_{0.2}Ga_{0.8}N$ with a molar fraction of Al being 0.2 in the mixed crystal. Subsequently, at substrate temperature of 1050° C., TMG, TMA, and ammonium gasses, as a source gas, and silane gas, as an impurity gas, are used to grow the n-type AlGaN layer 34B, doped with Si of $2\times10^{18}$ per cubic cm, in a film thickness of about 100 Å, the layer consisting of $Al_{0.2}Ga_{0.8}N$ with a molar fraction of Al being 0.2 in the mixed crystal. It can be considered that the undoped AlGaN layer 34B and n-type AlGaN layer 34A, in particular the Si-doped n-type AlGaN layer performs the function of supplying a carrier. Also, upon the Si-doped n-type AlGaN layer 34A is grown an n-type GaN layer in a film thickness of 3000 Å as an intermediate layer 38, the layer being doped with Si of $1\times10^{19}$ per cubic cm. After the completion of the reaction, the temperature is lowered down to room temperature, and the wafer is taken out of the reactor.

(Semiconductor Device Structure Processing Step, Drain Electrode Forming Step)

First, a spin coater is used to coat a resist for insulation of a portion other than a device forming area, and then a pattern is exposed for patterning the resist. Etching is performed by $Cl_2$ gas with ICP etching apparatus in order to etch the AlGaN and GaN layers for device isolation with plasma RIE apparatus. Here, in order to form a drain electrode 37 on the GaN layer, the GaN layer is removed in advance by etching, except for an area for the drain electrode 37 to be formed. Then, a magnetron sputtering apparatus is used to sputter Ti in a film thickness of 100 Å, and Al in 3000 Å with RF power of 500W; a Ti/Al drain electrode 37 is formed after lifting off. Subsequently, the electrode is subjected to annealing in a nitrogen gas atmosphere at 600° C. for 10 minutes, resulting in formation of the drain electrode 37 with a film thickness of about 300 nm.

(Support Substrate Bonding Step)

Next, as shown in FIG. 8A, the insulation protective film 84 is formed on a portion of semiconductor structure surface and drain electrode 37. Then, sequentially, the conductive bonding layer 85A on the side of the semiconductor structure is formed substantially all over the area of semiconductor structure surface, while forming the conductive bonding layer 85B on the side of bonding support substrate 83. As the insulation protective film 84, a $SiN/SiO_2$ film is now formed in a thickness of 1000/20000 Å, and Ti/Pt/Au/Sn/Au as the bonding layer 85A is sputtered for film formation, and also Ti/Pt/Au as the bonding layer 85B is sputtered on a Cu—W substrate of the support substrate 83 for film formation. Subsequently, the bonding layer 85 is bonded by thermocompression bonding as shown in FIG. 8A.

(Growth Substrate Removing Step, Semiconductor Device Structure Processing Step, Source and Gate Electrodes Forming Step)

Next, in order to form the carrier transit layer 33 of undoped GaN, the sapphire substrate 81 is removed by means of laser lifting-off, and buffer layer 82 and a portion of underlying layer is polished for removal. For the removal, the undoped GaN layer is polished on its back surface to the order of 1 μm in film thickness. Further, as shown in FIG. 8C, etching is respectively performed in areas for the gate electrode 36 and source electrode 35 to be formed on the undoped GaN layer. The area for formation of a gate electrode is thus groovily removed to obtain a concaved shape, with the film thickness of the undoped GaN layer 33 being on the order of 1000 Å at the concaved bottom. Also, the area for formation of a source electrode is the area including the end surface of the undoped GaN layer 33, so that the undoped GaN layer which is a partial area of the semiconductor structure is removed at a depth where the undoped AlGaN layer 34B is exposed. Subsequently, the gate electrode 36 and the source electrode 35 are formed. For the source electrode 35, like for the drain electrode 37, the magnetron sputtering apparatus is also used to sputter Ti in a film thickness of 100 Å, and Al in a film thickness of 3000 Å with RF power of 500W; a Ti/Al source electrode 35 with a film thickness of about 300 nm is formed after lifting off. For the gate electrode 36, on the other hand, there is formed a Ni/Au Schottky electrode, as an electrode with a film thickness of about 300 nm, at the bottom of the concaved portion in the undoped GaN layer 33.

In this way, after the source and gate electrodes are respectively formed on the opposing sides of the support substrate of semiconductor structure, a pad electrode is formed which is provided for external connection on the gate electrode 36 and the source gate 35 respectively. Now for the pad electrode, Ni and Au are sputtered and lifting-off is performed to form a Ni/Au pad electrode. Finally, for insulation in each electrode and between its external connections, an insulation protective film of $SiN/SiO_2$ with a thickness of 1000/20000 Å is formed substantially all over the semiconductor structure and the device structure on the side of the source and gate electrodes, and the insulation film is removed in a partial area of each pad electrode, so that the external connection is exposed.

In this example, when viewed in a cross-sectional structure as shown in FIG. 8C, the semiconductor structure 86 and the electrode structure, which are formed by bonding to the support substrate 83, are provided with the drain electrode 37 on one principal plane of the semiconductor structure 86 and with the gate electrode 36 and source electrode 35 on the other principal plane, so as to be secured to the support substrate 83 through the bonding layer 85 on the formation side of the drain electrode 37 and to be electrically connected to the drain electrode. This structure preferably enables the drain electrode 37 to be extracted from the side of conductive support substrate 83, so that the gate electrode and the drain electrode can be in a spaced-apart, opposing structure, i.e., in a vertical FET structure. Here, for a conductive support substrate, a semiconductor substrate such as Si, GaAs, and GaN can be employed in addition to Cu—W. In the case of a semiconductor substrate, an electrode is provided on the back surface of the support substrate. Also when an insulating substrate such as a sapphire substrate, etc. is employed, the drain electrode can be extracted from the side of the support substrate by partially removing the support substrate and allowing the drain electrode to be exposed. Although the structure is employed for securing the drain electrode formation side to the support substrate, in FIG. 8, it goes without saying that a structural variant may also be employed for securing the gate and source electrode formation side to the support substrate.

(Packaging)

After the completion of the above device steps, the chip is mounted into a package. Here, when wire lines are provided, a wire bonder is used. By virtue of the wire bonding, heat can be dissipated from the electrode through the wire lines, and also an inductance component can be adjusted by varying the length of wire lines, so that the operation can be harmonized in a preferred manner. In the case of wireless bonding, on the other hand, another thermally conductive substrate can be provided on the gate electrode and the source electrode, so that the heat dissipation characteristics can be improved. Also, a pad for wire bonding can be dispensed with, which will be suitable for miniaturization of the device. In addition, advantages can be enjoyed in that the inductance component resulting from the wires and the capacitance component between the wires or between the wires and the main body of the semiconductor device are reduced.

Also, without being limited to the present embodiments, when the carrier supply layer (typically, an n-type AlGaN) of the HEMT is prepared to be as thin as less than 2.5 nm, an arrival of electron can be expedited for an increased aspect ratio, a controlled short channel effect, and a controlled leakage current, which are of a structure that is more suitable for a high-speed operation.

INDUSTRIAL APPLICABILITY

The field effect transistor and the method of manufacturing the same in accordance with the present invention can be utilized for HEMTs with high electron mobility in the carrier transit layer, being also suitably utilized as a power device and a high frequency drive device for a low-loss power conversion device, a drive device for electric cars and home-use inverters, etc.

It should be apparent to those with an ordinary skill in the art that while various preferred embodiments of the invention have been shown and described, it is contemplated that the invention is not limited to the particular embodiments disclosed, which are deemed to be merely illustrative of the inventive concepts and should not be interpreted as limiting the scope of the invention, and which are suitable for all modifications and changes falling within the spirit and scope of the invention as defined in the appended claims. This application is based on Application No. 2005-88909 filed in Japan on Mar. 25, 2005, the content of which is incorporated hereinto by reference.

What is claimed is:

1. A field effect transistor comprising:
   a semiconductor structure containing a carrier transit layer, the semiconductor structure being made of a Group III-V compound semiconductor layer;
   a gate electrode and a source electrode disposed respectively on or above the semiconductor structure; and
   a drain electrode disposed on an opposing side of the semiconductor structure where the gate electrode is disposed,
   wherein the drain electrode is formed partially on said opposing side, in a non-overlapping position with the gate electrode.

2. The field effect transistor as recited in claim 1, wherein the carrier transit layer contained in the semiconductor structure has an end surface exposed on a side where the source electrode is disposed, and the source electrode is disposed to make an ohmic contact with the end surface.

3. The field effect transistor as recited in claim 1, wherein the field effect transistor is a high electron mobility transistor.

4. The field effect transistor as recited in claim 1,
   wherein the gate electrode is annularly disposed so as to surround an area where the source electrode is disposed, and
   wherein the drain electrode is annularly disposed so as to surround an area on opposing side of the semiconductor structure where the gate electrode is disposed.

5. The field effect transistor as recited in claim 1,
   wherein, the gate electrode is annularly disposed so as to surround an area on opposing side of the semiconductor structure where the drain electrode is disposed, and
   wherein the source electrode is annularly formed so as to surround an area where the gate electrode is disposed.

6. The field effect transistor as recited in claim 1,
   wherein the semiconductor structure contains a first semiconductor layer and a second semiconductor layer having a band gap energy greater than that of the first semiconductor layer,
   wherein the gate electrode and the source electrode are disposed respectively on a side of the first semiconductor layer, and
   wherein the drain electrode is disposed on a side of the second semiconductor layer.

7. The field effect transistor as recited in claim 6, wherein the second semiconductor layer has an AlGaN layer.

8. The field effect transistor as recited in claim 6, wherein the second semiconductor layer has an undoped AlGaN layer and a Si-doped AlGaN layer.

9. The field effect transistor as recited in claim 6, wherein the carrier transit layer contained in the semiconductor structure has an end surface exposed on a side where the source electrode is disposed, and the source electrode is disposed to make an ohmic contact with the end surface.

10. The field effect transistor as recited in claim 9, wherein the first semiconductor layer is the carrier transit layer, and the second semiconductor layer is a carrier supply layer.

11. The field effect transistor as recited in claim 6, wherein the second semiconductor layer and the drain electrode has an intermediate layer disposed therebetween.

12. The field effect transistor as recited in claim 11,
    wherein the second semiconductor layer has an AlGaN layer, and
    wherein the intermediate layer is made of GaN.

13. The field effect transistor as recited in claim 6, wherein the first semiconductor layer is the carrier transit layer, and the second semiconductor layer is a carrier supply layer.

14. A field effect transistor comprising:
    a semiconductor structure containing a first semiconductor layer and a second semiconductor layer, the second semiconductor layer having a band gap energy greater than that of the first semiconductor layer, the first and second semiconductor layers being made of a gallium nitride-based compound semiconductor layer;
    a gate electrode and a source electrode disposed respectively on the first semiconductor layer side of the semiconductor structure; and
    a drain electrode disposed on the second semiconductor layer side and opposed to a side of the semiconductor structure where the source electrode is disposed.

15. The field effect transistor as recited in claim 14, wherein the second semiconductor layer has an AlGaN layer.

16. The field effect transistor as recited in claim 15, wherein the second semiconductor layer has an undoped AlGaN layer and a Si-doped AlGaN layer.

17. The field effect transistor as recited in claim 16, wherein the semiconductor structure has a carrier transit layer having an end surface exposed on a side where the source electrode is disposed, and the source electrode is disposed to make an ohmic contact with the end surface.

18. The field effect transistor as recited in claim 17, wherein the second semiconductor layer and the drain electrode has an intermediate layer disposed therebetween.

19. The field effect transistor as recited in claim 18, wherein the intermediate layer is made of GaN.

20. The field effect transistor as recited in claim 19, wherein the first semiconductor layer is the carrier transit layer, and the second semiconductor layer is a carrier supply layer.

* * * * *

UNITED STATES PATENT AND TRADEMARK OFFICE
CERTIFICATE OF CORRECTION

PATENT NO. : 7,339,206 B2
APPLICATION NO. : 11/387847
DATED : March 4, 2008
INVENTOR(S) : Shiro Akamatsu et al.

It is certified that error appears in the above-identified patent and that said Letters Patent is hereby corrected as shown below:

<u>The Title page of Patent No. 7,339,206 B2 item No. (73) Assignee:</u>

The line reading "Nichia Corporation, Ana-Shi, Tokushima (JP)" should read -- Nichia Corporation, Anan-Shi, Tokushima (JP) --

Signed and Sealed this

Eighth Day of July, 2008

JON W. DUDAS
*Director of the United States Patent and Trademark Office*